(12) United States Patent
Takabayashi et al.

(10) Patent No.: US 6,702,413 B2
(45) Date of Patent: Mar. 9, 2004

(54) LIQUID DISCHARGE HEAD, LIQUID DISCHARGE APPARATUS, AND IC PACKAGE STRUCTURE

(75) Inventors: Hiroshi Takabayashi, Kanagawa (JP); Tadayoshi Muta, Saitama (JP); Toru Yamane, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/987,504

(22) Filed: Nov. 15, 2001

(65) Prior Publication Data

US 2002/0149636 A1 Oct. 17, 2002

(30) Foreign Application Priority Data

Nov. 16, 2000 (JP) .......................... 2000/348952

(51) Int. Cl.[7] ............................. B41J 25/308; B41J 2/05
(52) U.S. Cl. ............................................. 347/8; 347/59
(58) Field of Search ............................. 347/8, 50, 58, 347/59

(56) References Cited

U.S. PATENT DOCUMENTS

| | | | |
|---|---|---|---|
| 5,227,812 A | * 7/1993 | Watanabe et al. | 347/50 |
| 5,478,606 A | 12/1995 | Ohkuma et al. | 427/555 |
| 5,805,176 A | 9/1998 | Saito et al. | 347/8 |
| 6,024,439 A | 2/2000 | Sueoka et al. | 347/50 |
| 6,062,675 A | 5/2000 | Hirosawa et al. | 347/50 |
| 6,092,892 A | 7/2000 | Taniguro et al. | 347/104 |

FOREIGN PATENT DOCUMENTS

| | | |
|---|---|---|
| JP | 61-16861 | 1/1986 |
| JP | 6-286127 | 10/1994 |
| JP | 6-286149 | 10/1994 |
| JP | 7-285251 | 10/1995 |
| JP | 7-323622 | 12/1995 |
| JP | 10-138463 | 5/1998 |
| JP | 11-58706 | 3/1999 |
| JP | 11-138928 | 5/1999 |

* cited by examiner

*Primary Examiner*—Judy Nguyen
*Assistant Examiner*—Michael S Brooke
(74) *Attorney, Agent, or Firm*—Fitzpatrick, Cella, Harper & Scinto

(57) ABSTRACT

A liquid discharge head which comprises an element substrate having on one surface thereof energy generating element for generating energy to be utilized for discharging liquid from a liquid discharge port, and a liquid supply port communicated with the liquid discharge port, a printed substrate provided with an external fetch electrode, and an IC component for control use for the energy generating element having provided therefor an output side electrode connected with the energy generating element and an input side electrode connected with the external fetch electrode. For this liquid discharge head, at least the aforesaid output side electrode of the IC component for control use is provided for the one surface of the element substrate. With the structure thus arranged, it is made easier to elongate the liquid discharge head in higher precision, and also, as compared with the case where the driver (driving element) for the discharge energy generating element is incorporated on the assembling substrate, the nondefective ratio of the finished products thereof is enhanced, hence contributing to the manufacture at lower costs.

18 Claims, 9 Drawing Sheets

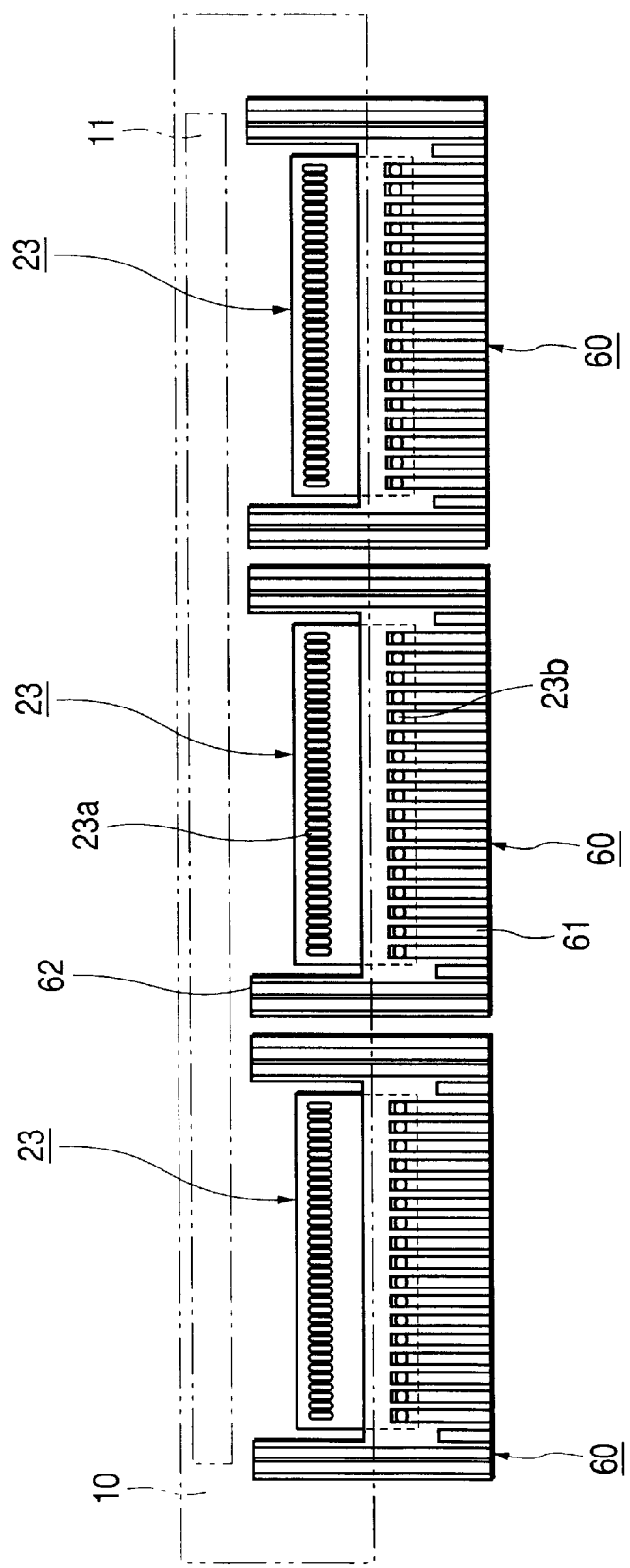

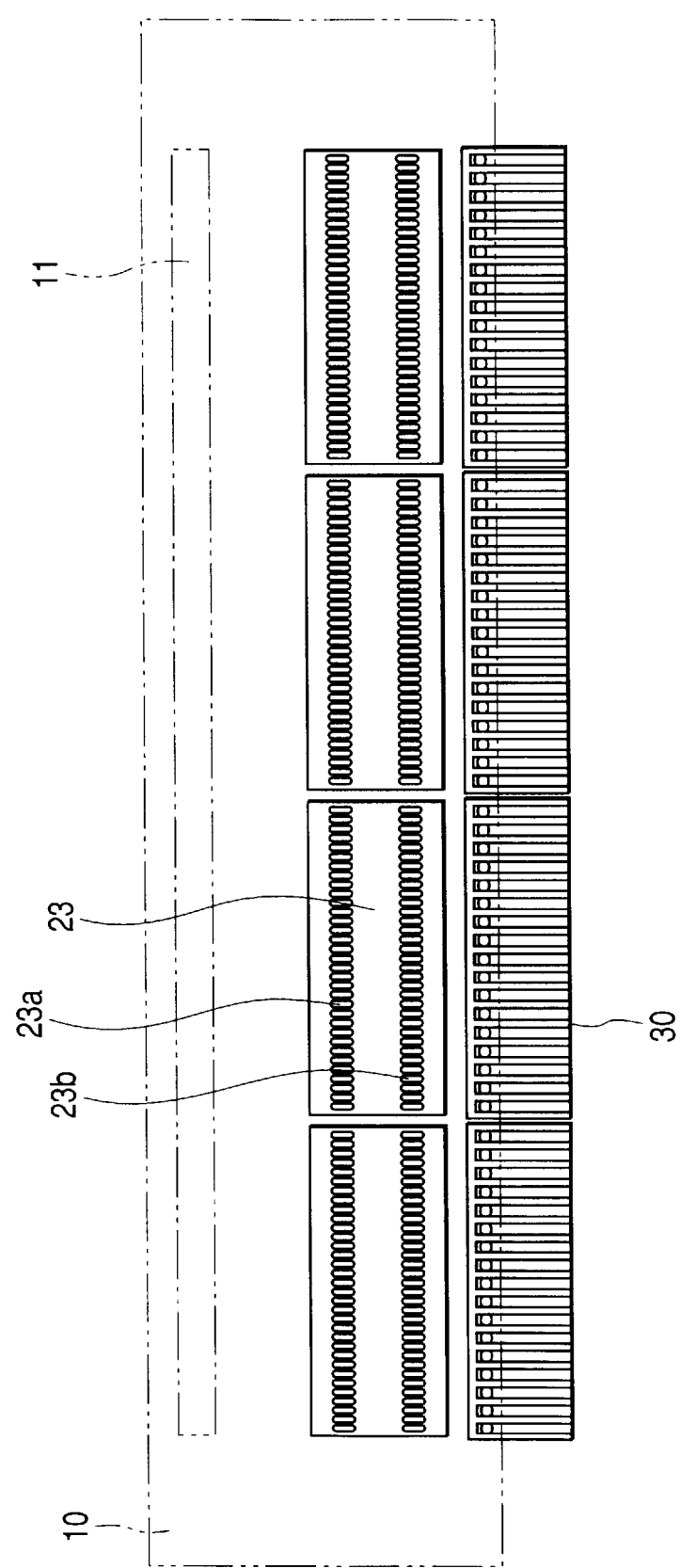

LIQUID DISCHARGE HEAD, LIQUID DISCHARGE APPARATUS, AND IC PACKAGE STRUCTURE

BACKGROUND OF THE INVENTION

1. Field of the Invention

The present invention relates to a liquid discharge head used for an ink jet recording head or the like, and a liquid discharge apparatus. The invention also relates to an IC package structure. Among them, the invention is particularly effective in the application to the so-called side shooter type liquid discharge head having substantially the perpendicular discharge direction of ink liquid droplets or the like to the assembling surface of the substrate thereof.

2. Related Background Art

In conjunction with FIG. 12, the description will be made of the conventional liquid discharge head, such as an ink jet recording head. The ink discharge area A of a head shown in FIG. 12 is formed in such a way that the ink supply port 111 is provided in a silicon substrate 110 by means of chemical etching or laser or some other light energy; the electrothermal converting element 112 that serves as a discharge energy generating member is arranged on the silicon substrate 110; the covering resin layer 120 that becomes the walls of an ink flow path 121 is provided; and the ink discharge port (orifice) 122 is formed in the covering resin layer 120. The method of manufacture thereof is publicly known by Japanese Patent Laid-Open Application No. 06-286149 and others.

For the aforesaid side shooter type ink jet recording head, the distance between the ink discharge port 122 and the electrothermal converting element 112, that is, an orifice distance, can be formed easily by means of a photolithographic technique. Accordingly, it is possible to manufacture an ink jet recording head that can consistently discharge small liquid droplets of ink.

The structural character of the side shooter type ink jet recording head has the following requirements:

1. The thickness thereof should be smaller in the bubble growing direction or the ink discharge direction. With a shorter distance between the covering resin layers, having the orifices formed therefor, and a recording sheet (paper), namely, the distance to the recording sheet (paper), it becomes possible to prevent the head and the recording sheet from rubbing against each other due to the deformation (cockling) of the recording sheet. The cockling results from the curling of paper by changes of environment or the swelling of fibers caused by the permeation of ink into paper. With the shorter distance between the covering resin layer and the recording sheet, it is also possible to make the deviations of target position of impact smaller so as to obtain a desired image. More specifically, the distance to a recording sheet (paper) is required to be approximately 1 mm.

2. The electrothermal converting elements should be formed in high density on the assembling surface of the substrate perpendicular to the ink discharge direction or the bubble growing direction. More specifically, it is required to provide them in a precision of 600 to 1,200 dpi or more than 1,200 dpi.

In order to attain these requirements efficiently, the head shown in FIG. 12 is provided with a driver built-in area 123 formed on the silicon substrate 110. The control circuit for the aforesaid electrothermal converting element 112 is incorporated here. The electrodes of a flexible printed substrate (FPC) 130 and the electrodes of the silicon substrate 110 are positioned to face each other on the assembling area B of the silicon substrate 110, which are connected through an anisotropic conductive film or the like (not shown). The connecting portion is sealed and protected by a sealing resin 131. In this manner, the assembling structure is adapted to connect with an external circuit (not shown).

In this case, the bubble growing direction, that is, the thickness of the ink jet recording head in the ink discharge direction, is determined by the height of assembling, that is, the thickness (approximately 25 to 150 $\mu$m) of the flexible printed substrate 130, and the thickness of the sealing resin 131 provided for the connecting portion.

The bubble growing direction of this assembling structure, that is, the assembling surface in the direction perpendicular to the ink discharge direction, there is contained the aforesaid built-in control circuit for the electrothermal converting element 112 on the driver built-in area 123 on the silicon substrate 110 described above. The control circuit and the electrothermal converting element 112 are formed by means of photolithographic technique.

Consequently, even when the ink discharge port has a precision of 600 dpi or more, the assembling density can be made as roughly as 100 to 400 $\mu$m on the assembling area B where the source supply of electric power for the control circuit and electrodes on the input control signal side are drawn by use of the flexible printed substrate.

Next, in conjunction with FIG. 13, the description will be made of another conventional example disclosed in the specification of Japanese Patent Laid-Open Application No. 06-286127. Here, it is devised to make the thickness of the head smaller by externally installing an IC component (driving element) 223 for control use with inclination to the side opposite to the discharge direction of droplet ID to a recording medium P from the orifice (ink discharge port) 222 formed on the covering resin layer 221 on the substrate 210. The assembling density of the assembling area B on the flexible printed substrate 230 is almost equal to the density of the orifice 222 and the electrothermal converting element (not shown), and the control IC component 223 is connected to the flexible printed substrate 230 by means of die-bonding wire, and then, covered by the sealing resin 231. Consequently, to be in high density is dependent on the assembling density of the flexible printed substrate 230. In this respect, a reference mark IT designates an ink tank.

Now, to meet the demand for enhancing the printing quality and printing speed, the side shooter type ink jet recording head is required to be elongated. However, when the driver built-in head as shown in FIG. 12 is elongated, the following problems are encountered with respect to the assembling structure.

1. A number of substrates that can be taken from one wafer are reduced, leading to the increase in manufacturing costs. For example, in a simulation of a 4-inch recording head with the structure that has the control circuit incorporated therein, the size of the 4-inch recording head becomes approximately 8 mm×100 mm. However, only four of them can be taken from a 5-inch wafer; nine from a 6-inch wafer; and twenty-one from an 8-inch wafer.

2. The non-defective ratio becomes smaller. Assuming that the general CMOS process crystalline defect ration D≃0.003, the yield of the built-in control circuit is worked out. Then, no perfect products are obtainable from a 5- or 6-inch wafer. Also, only one perfect product is obtainable from an 8-inch wafer eventually.

For reference, the non-defective ratio is expressed by Y=exp (−S×D), S (area)=XY.

This brings about an extremely serious problem in the production when the head is elongated.

Also, for the conventional example of the ink jet recording head shown in FIG. 13, the assembling density on the assembling area of the flexible printed substrate 230 is substantially equal to the density of the orifice 222 and the electrothermal converting element provided for the ink discharge port area A.

However, since wiring is formed by copper foil or the like on the flexible printed substrate 230 which is formed by polyimide or the like, the limit of the precision degree is approximately 500 dpi, and there is a problem encountered that the elongation is possible only up to approximately 25 mm in terms of the practicable dimension in consideration of the stretch and contraction thereof caused by the linear expansion coefficient of polyimide and others.

SUMMARY OF THE INVENTION

It is one of the objects of the present invention to provide a liquid discharge head, a liquid discharge apparatus, and an IC package structure, for which promotion is possible to make the preciseness of the head higher still, and also, to the thickness thereof smaller and the length larger, as well as to make the printing speed significantly faster, while enhancing the production yield and increasing the number of substrates taken to contribute to reducing the costs of manufacture.

It is another object of the invention to provide a liquid discharge head which comprises an element substrate having on one surface thereof energy generating element for generating energy to be utilized for discharging liquid from a liquid discharge port, and a liquid supply port communicated with the liquid discharge port; a printed substrate provided with an external fetch electrode; and an IC component for control use for the energy generating element having provided therefor an output side electrode connected with the energy generating element and an input side electrode connected with the external fetch electrode. For this liquid discharge head, at least the aforesaid output side electrode of the IC component for control use is provided for the one surface of the element substrate.

It is still another object of the invention to provide a liquid discharge apparatus which comprises a liquid discharge head comprising an element substrate having on one surface thereof energy generating element for generating energy to be utilized for discharging liquid from a liquid discharge port, and a liquid supply port communicated with the liquid discharge port; a printed substrate provided with an external fetch electrode; and an IC component for control use for the energy generating element having provided therefor output side electrode connected with the energy generating element and input side electrode connected with the external fetch electrode, at least the aforesaid output side electrode of the IC component for control use being provided for the one surface of the element substrate, and conveying means for conveying a recording medium to face the liquid discharge port of the liquid discharge head.

It is a further object of the invention to provide an IC package structure provided with an IC component for control use and a flexible printed substrate. For this IC package structure, the flexible printed substrate comprises a first external fetch electrode directly connected with the extruded electrode of the IC component for control use individually, and a second external fetch electrode directly connected with the electrode of an assembling substrate for assembling the IC component for control use.

In accordance with the present invention, the IC component for control use is assembled face down on the substrate. Then, this is connected with the external power supply source and others by use the flexible printed substrate. Therefore, as compared with the case where the driver (driving element) for the discharge energy generating element is incorporated on the assembling substrate, the nondefective ratio of finished products can be enhanced. Also, the invention contributes significantly to the head elongation and the higher preciseness thereof.

Further, the present invention is arranged to enable the supply ports, for use of the liquid supply, to be open to the element substrate having at least the output side electrode of the IC component for control use provided therefor. This arrangement is favorable from the standpoint of thermal stabilization. Particularly, it is preferable, from the standpoint of structural arrangement, to arrange the liquid supply port and the printed substrate on opposite sides of the IC component for control use.

With the structure in which both the input side electrode and the output side electrode of the IC component for control use are installed on one surface of the integrated substrate, the positioning precision is made higher for the electrodes to enhance the reliability of the electrode connection. Further, it is easier for the integrated substrate, to which all the electrodes of the IC component for control use, to become thermally uniform. This is particularly preferable in terms of the reliability of electrode connection.

The extrude electrode of the IC component for control use on the input side is directly connected with the external fetch electrode of the flexible printed substrate, which enables the assembling substrate to be made smaller and a number of substrates taken to be increased. In this way, the productivity of the liquid discharge head is significantly enhanced to implement the manufacture of an elongated and highly precise ink jet recording head and others at lower costs.

Also, the second external fetch electrode provided for the flexible printed substrate is connected direction with the assembling surface, which enables the wiring resistance of the control circuit, which controls the discharge energy generating element on the assembling surface, to be reduced significantly to improve the driving efficiency of the discharge energy generating element, while enhancing the printing quality and printing speed as well. Further, this arrangement contributes to making the chip size of the IC component for control use smaller or the like.

BRIEF DESCRIPTION OF THE DRAWINGS

FIGS. 7A and 7B are plane views which illustrate the embodiment of an elongated head.

DESCRIPTION OF THE PREFERRED EMBODIMENTS

In conjunction with the accompanying drawings, the embodiments will be described in accordance with the present invention.

Figure 1:
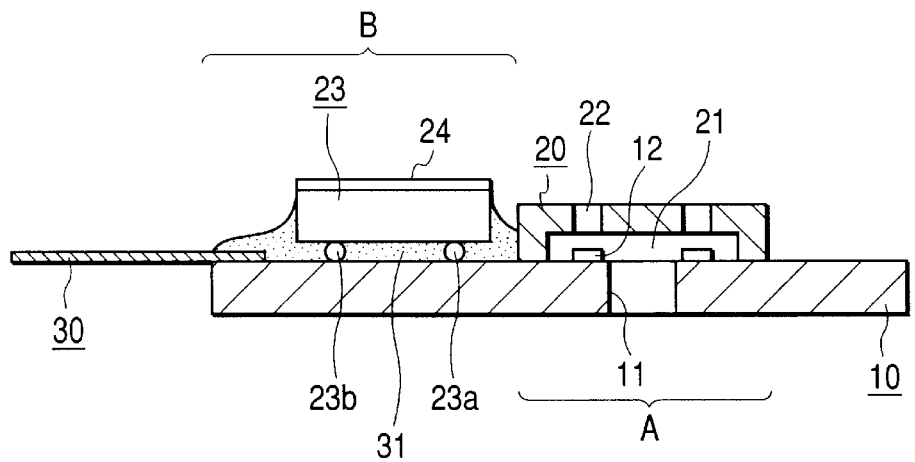
FIG. 1 is a cross-sectional view which shows a first embodiment schematically.

FIG. 1 is a view showing a liquid discharge head in accordance with a first embodiment. The liquid discharge head is an ink jet recording head having an ink discharge port area A on the substrate (element substrate) 10 serving as an aluminum or silicon assembling substrate. In the substrate 10, an ink supply port 11 is formed using chemical etching or light energy such as laser, and the electrothermal converting element 12 is provided for the substrate 10 to generate discharge the energy. The covering resin layer 20 is provided to serve as the liquid flow path formation layer which becomes the walls for the ink flow path 21 serving as a liquid flow path. With this arrangement, the ink discharge port (orifice) 22 is formed and functions as a liquid discharge port.

Here, no driver is incorporated for the substrate 10, but the IC chip 23, which is an external IC component for control use, is used. Therefore, it is unnecessary to limit the material of the substrate 10 to silicon. A metallic substrate such as aluminum or a glass substrate may be usable.

On the IC chip assembling area B, the bump 23a, which is the extruded electrode on the output side, and the bump 23b, which is the extruded electrode on the input side, are formed to face the electrodes of the substrate 10 for the installation of the IC chip 23 for control use which is produced by means of a high-pressure resistance CMOS process.

Between the IC chip 23 and the substrate 10, a resin layer 31 is provided to connect the bumps 23a and 23b of the IC chip 23 and the substrate electrodes directly.

As the resin layer 31, there may be used, among some others, an anisotropic conductive film (FP13414S manufactured by Sony Chemical K.K.) which has anisotropic conductive property with the conductive particles dispersed and contained in an insulating resin, while supporting the contact connection between the bumps 23a and 23b of the IC chip 23, and the electrodes of the substrate 10 or an insulating paste (NEX-151 manufactured by Shin Nittetsu Chemical K.K.) that begins to make the contact connection between the bumps 23a and 23b of the IC chip 23, and the electrodes of the substrate 10 when pressurized, while supporting the contact connection between the bumps 23a and 23b of the IC chip 23, and the electrodes of the substrate 10 by the contraction thereof when thermally hardened. It has been confirmed that these present no problem in the connection and insulation characteristics. Particularly, the condition, in which the contact connection between the bumps 23a and 23b of the IC chip 23 and the electrodes of the substrate 10 is supported by the hardened and contracted resin layer 31, has close relationship with the objectives of the present invention to assemble the IC chip as thin as possible. Here, additionally, the description will be given below.

The soldering flipchip bonding is known as a method for connecting the electrodes of the substrate and the bumps of IC chip directly, and also, it is known in general that the higher the connecting height, the longer is the life. This is known in the article "Optimal Control of Connecting Configuration of IC•LSI microsoldering connection" in the Journal of Japan Metal Society No. 51-6 (1987). However, it is known by the publication "Bond Stability of Element Bonding Using Anisotropic Conductive Bonding Agent" 2nd Symposium "Microjoining and Assembly Technology in Electronics" February 1–2, 1996, Yokohama that the lower the height of connection, the better is the result obtainable for the structure in which a resin layer is provided between an IC chip and the electrodes of a substrate, and then, the bumps of the IC chip and the electrodes on the substrate are given contact connection through the resin layer.

The resin layer is not necessarily the one that can be hardened and contracted by the application of heat, but may be the one that can be hardened and contracted by the application of heat and/or UV light.

Next, the description will be made of a first embodiment. Those related to dimensions are as follows:

Recording head:

Silicon substrate 8 mm×100 mm (approximately 4 inches)

256 bit×9 IC installation corresponding to 600 dpi

IC chip:

2.5 mm×10.0 mm, 256 bit shift register·latch·high pressure resistive driver, chip thickness, 300 $\mu$m and 175 $\mu$m, bump height, 18 $\mu$m In accordance with the present embodiment, the widthwise dimension is not different from that of the conventional head, but the conventionally incorporated driver is externally installed. In this way, the number of masks and the degree of preciseness are reduced, thus enhancing the yield significantly.

Here, in accordance with the experiments and simulations that the inventors hereof have carried out, the defect ratio is reduced to approximately ¹⁄₁₀, and the nondefective ratio is anticipated to be up to approximately 79% when the aforesaid embodiment is applied. Then, approximately 16 perfect products are obtainable from one 8-inch wafer.

The bump 23a of the IC chip 23 on the output side controls the driving of the electrothermal converting element 12 through the connection with the electrodes of the substrate 10. The bump 23b of the IC chip 23 on the input side is connected individually with the external circuit (not shown) by means of the external fetch electrodes on the flexible printed substrate 30 through the electrodes of the substrate 10.

The assembling density of the connections between the bump 23b of the IC chip 23 on the input side and the electrodes of the substrate 10, and the flexible printed substrate 30 is as roughly as 100 to 400 $\mu$m, hence presenting no problem in the production end at all.

Figure 2:
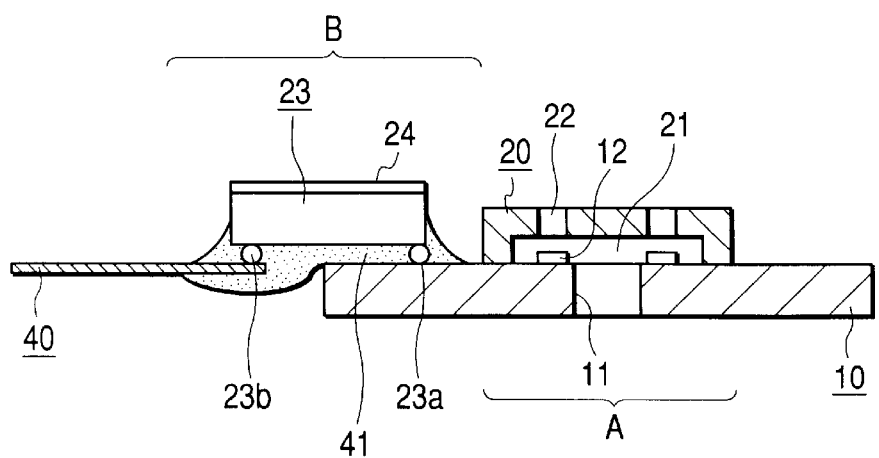
FIG. 2 is a cross-sectional view which shows a second embodiment schematically.

FIG. 2 is a view which illustrates a second embodiment. The structures of the ink discharge port area A and the IC chip 23 are the same as those of the first embodiment shown in FIG. 1. Therefore, the same reference marks are applied, and the description thereof will be omitted.

On the IC chip assembling area B, the extruded bump 23a, which is the extruded electrode on the output side, is formed on the IC chip 23 which is produced by means of the high pressure resistive CMOS process, and installed to face the electrodes of the substrate 10.

A resin layer 41 is provided between the IC chip 23 and the substrate 10, and the bump 23a of the IC chip 23 on the output side and the electrodes of the substrate are connected directly.

Also, the bump 23b of the IC chip 23 on the input side is individually connected with the external fetch electrodes on the flexible printed substrate 40, hence fetching external electric power. In this way, the size of the substrate 10 is made smaller.

For the resin layer 41, the one used for the head shown in FIG. 1 is equally usable. Also, for the connection between the bump 23b on the input side and the flexible printed substrate 40, it may be possible to use the same one as the resin layer 41 or adopt a method for bonding eutectic crystal alloys of Au—Au or Au—Sn.

Next, the second embodiment will be described.

Recording head:

Silicon substrate 5 mm×100 mm (approximately 4 inches)

256 bit×9 IC installation corresponding to 600 dpi IC chip, the same specification as the first embodiment In accordance with the present embodiment, the widthwise dimension of a recording head can be made smaller considerably as compared with the conventional example and the first embodiment described above. Also, in the same way as the first embodiment, the yield is significantly enhanced with the reduction of mask numbers and degree of preciseness resulting from the external installation of the driver which has been built in conventionally.

Here, in accordance with the experiments and simulations that the inventors hereof have carried out, the defect ratio is reduced to approximately 1/10 with the number of substrates being 39 taken from one 8-inch wafer, and the nondefective ratio is anticipated to be up to approximately 86% when the second embodiment is applied. Then, approximately 33 perfect products are obtainable from one 8-inch wafer.

The simulation is made on the assumption that a circular type silicon wafer is used as the substrate, but there is no problem at all if a silicon wafer is square or rectangular.

Figure 3:
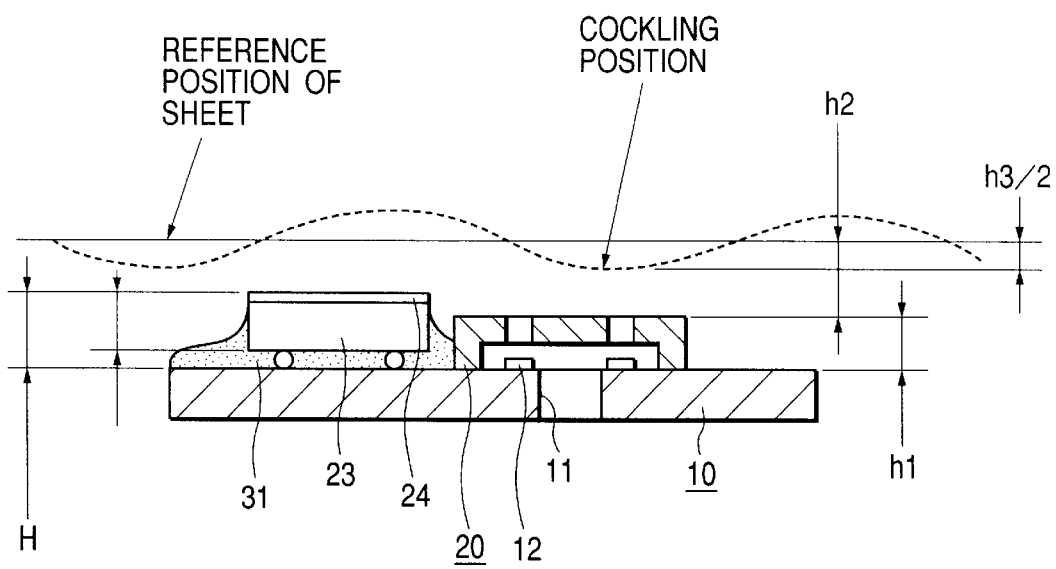
FIG. 3 is a view which illustrates the assembling height of an IC chip.

Next, with reference to FIG. 3, the description will be made of the assembling height H of the IC chip 23 of the first and second embodiments. As publicly known by the specification of Japanese Patent Laid-Open Application No. 06-286149, the orifice distance h1, that is the thickness of the covering resin layer 20, is practically set to be as thin as h1≃0.02 to 0.1 mm approximately when manufactured for a recording head specified to provide microliquid droplets. The standard position of the recording sheet (paper) is indicated by solid line. The broken line indicates a state of cockling being generated.

Cockling changes depending on the kind of paper, and the amount of ink discharged at a time, and it has been attempted to reduce the degree of cockling by use of paper the fiber directionality of which is random to elongate the paper sheet in multiple directions or by means of printing method, such as divisional recording, reciprocal print scanning, which is known by the specification of Japanese Patent Laid-Open Application No. 10-138463, or by means of the method for improving the conveyance system of paper sheet disclosed in the specifications of Japanese Patent Laid-Open Application No. 07-285251, Japanese Patent Laid-Open Application No. 07-323622, Japanese Patent Laid-Open Application No. 11-138928, Japanese Patent Laid-Open Application No. 11-058706, and others. In practice, however, the status quo is such that the amplitude of cockling is set at h3≃1 mm, the distance to recording sheet (paper) is set at h2≃approximately 1 mm as disclosed in the specification of Japanese Patent Laid-Open Application No. 10-138463. The setting of the distance to recording sheet (paper) is determined in consideration of the suppression of such drawback as the displacement of ruled line, uneven density, color deviation, and color unevenness that may be brought about by the deviation of target impact position of ink. In recent years, along with more demands for higher image quality, it is required to suppress the amplitude of cockling to make the distance to the recording sheet (paper) smaller still.

When the assembling height of an IC chip is taken into consideration, it is possible to set the amplitude of cockling so as to create undulation equal to the standard position of paper, and also, it should be good enough if only the setting is made so that any rubbing mark of ink is not left on the recording sheet due to contact with any of the assembled components. Thus, the object is attainable if the intended assembling height H satisfies a relation of H<h1+h2−h3/2.

In addition, there is a need for the prevention of a recording sheet (paper) from abutting against the side shooter type recording head by setting a threshold value for the assembling height H, because when the amplitude of cockling is suppressed to be less than 1 mm, the side shooter type recording head should be protected from being damaged by the recording sheet that may abut against it. A problem of the kind is sometimes encountered when the distance to a recording sheet (paper) is made smaller still for the attainment of the enhanced printing quality.

In other words, it is more preferable to set the assembling height H so that it satisfies a relation of h1+h3/2<H<h1+h2−h3/2.

Also, with the IC chip for control use arranged on the sheet feeding side in relation to the ink discharge port, where cockling becomes smaller, it becomes possible to prevent more reliably the recording sheet (paper) from rubbing against the IC chip so as not to degrade the printing quality.

In this respect, the degree of preciseness, or density of ink discharge ports of the recording head is set at 600 dpi for the aforesaid embodiment, whereas the limit of the preciseness of the assembling structure is approximately 500 dpi when using the flexible printed substrate disclosed by the specification of Japanese Patent Laid-Open Application No. 06-286127 and others as described earlier. Here, in accordance with the aforesaid embodiment, it becomes possible to manufacture both the electrodes of the recording head and the bumps of the IC chip in good precision by means of the photolithographic technique, and also, to reduce the linear expansion coefficient by use of the silicon substrate so as to equalize the linear expansion coefficients of the recording head and the IC chip. Hence, the degree of preciseness of 600 dpi or more is made attainable.

Also, the length of the ink discharge port group of the recording head is set at approximately 4 inches, but as described earlier, the limit of the length of the flexible substrate of the assembled structure of the prior art that uses the flexible printed substrate disclosed by the specification of Japanese Patent Laid-Open Application No. 06-286127 and others is up to approximately 25 mm, while the degree of preciseness should be made higher still if a plurality of flexible substrates should be used. In practice, therefore, the limit of the length (distance from a discharge port on one end side to another discharge port on the other end side) of the ink discharge port group should be set at approximately 25 mm.

In contrast, the aforesaid embodiment makes it possible to meet the requirement that the length of the ink discharge port group should be more than 25 mm by changing the installation number of IC chips, because both the electrodes of the recording head and the bumps of the IC chip can be manufactured in good precision by means of photographic technique, and the linear expansion coefficient can be reduced by use of the silicon substrate, and then, the linear expansion coefficients of the recording head and the IC chip can be made equal to enable plural IC chips to be installed for the practical use.

Also, with the provision of insulating film 24 formed by $SiO_2$, SiN, or the like for the reverse side of the IC chip 23, it becomes possible to prevent any trouble that may produce adverse effect on printing due to the etching residue on the reverse side of the IC chip 23 caused by ink liquid droplets from the orifice portion. Here, it is needless to mention that depending on the properties of ink material, whether or not the aforesaid provision of the film is needed or the requirement changes as to the characteristics of the film to be provided.

Figure 4:
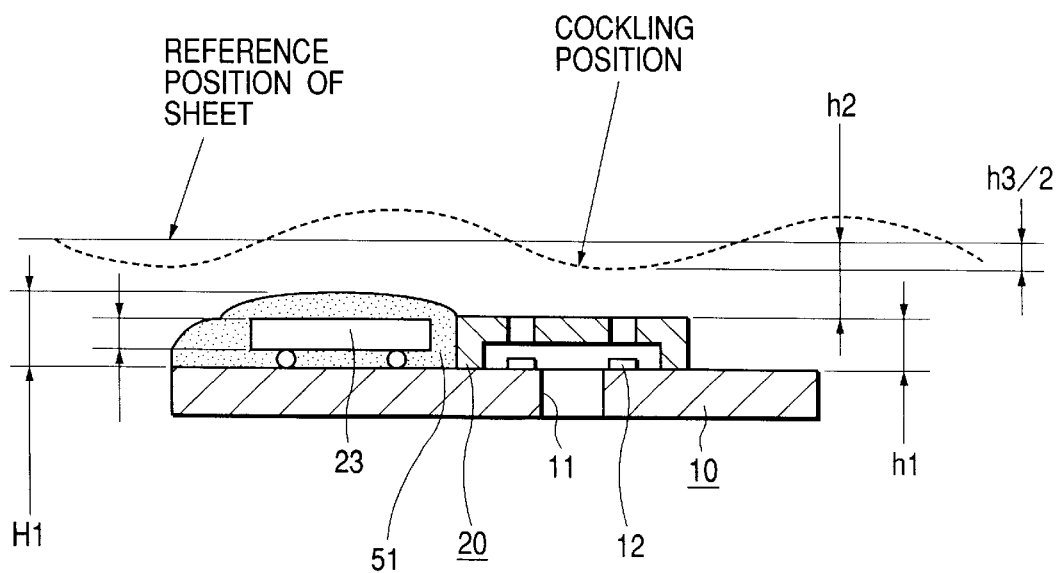
FIG. 4 is a view which illustrates the assembling height of the IC chip which is covered with sealing resin.

FIG. 4 shows the structure in which the reverse side of the IC chip 23 and the circumference thereof are covered by the resin layer 51 formed by silicone, epoxy, or other sealing resin in order to prevent any contamination from being caused by ink liquid droplets from the orifice portion. In this case, the assembling height Hi is up to the vertex of the resin layer 51, and as in the case described earlier, it is preferable for the structure to satisfy the relation of H1<h1+h2−h3/2 or more preferably, to satisfy the relation of H1+h3/2<H1<h1+h2−h3/2.

Hereunder, the specific examples of assembling heights H and H1 will be shown.

TABLE 1

| Specification of Recording Head | Orifice Distance h1 | Distance to Recording Sheet (paper) h2 | Cockling h3/2 | H, H1 Minimum Value | H, H1 Maximum Value |
|---|---|---|---|---|---|
| Small Liquid Droplet Discharge | 0.02 mm | 0.9 mm | 0.2 mm | 0.22 mm | 0.72 mm |
| Large Liquid Droplet Discharge | 0.10 mm | 1.3 mm | 0.5 mm | 0.51 mm | 0.90 mm |

As shown in the Table 1, when the specification of the recording head is for the small liquid droplet discharge, the covering resin layer, the thickness of which determines the orifice distance h1, is made smaller, and along therewith, the amplitude of cockling h3/2 is reduced, hence making the reduction possible for the distance to the recording sheet (paper) h2.

Also, when the specification of the recording head is for the large liquid droplet discharge, the covering resin layer, the thickness of which determines the orifice distance h1, is made larger, and along therewith, the amplitude of cockling h3/2 becomes larger, hence causing the distance to the recording sheet (paper) h2 to be made larger. With these values and the aforesaid relations, h1+h3/2<H<h1+h2−h3/2 and h1+h3/2<H1<h1+h2−h3/2, the respective minimum and maximum values are obtained.

From the contents of the Table 1, it is understandable that the aforesaid object can be achieved by defining the assembling height H of the IC chip for control use or the assembling height H1 of the sealing resin that covers the reverse side of the IC chip and the circumference thereof to be within a range of 0.22 mm to 0.9 mm.

Figure 9:
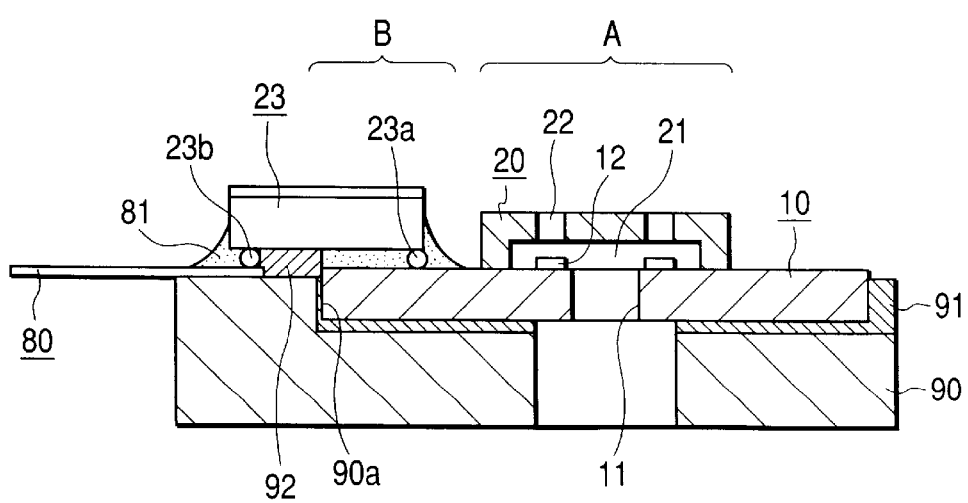
FIG. 9 is a view which schematically shows the supporting structure of the ink jet recording head in accordance with the second embodiment.

FIG. 9 illustrates the supporting structure of the head shown in FIG. 2, in which the substrate 10 of the recording head is fixed by use of bonding agent 91 to the stepped portion of the supporting member 90 which is formed by ceramics or the like with an ink supply port provided therefor, and then, the IC package, which is formed by the IC 23 and the flexible printed substrate 80, is fixed by use of bonding agent 92.

With the arrangement of the stepping portion 90a between the fixing portion of the substrate 10 and the fixing portion of the IC package, it becomes easier to install the recording head in high precision by means of contour abutting, and also, by making the clearance of fixing portion of the IC package smaller, it becomes possible to reduce stress given by the bonding agent 92 for fixing use to the IC package. In this way, a highly reliable structure can be manufactured. Here, it is possible to use the same kind of bonding agent for use as those at 91 and 92 or the one which is the same as the resin layer 81 in the IC chip assembling area B.

FIG. 7B is a plan view showing the embodiment in which the head represented in FIG. 1 is elongated. The same reference marks as those used for FIG. 1 are also used here, and the detailed description will be omitted. For this embodiment, however, an ink supply port 11 is provided to be open commonly to plural sets of flexible printed substrates 30 and IC chips 23 connected to each of them, respectively.

Figure 5:
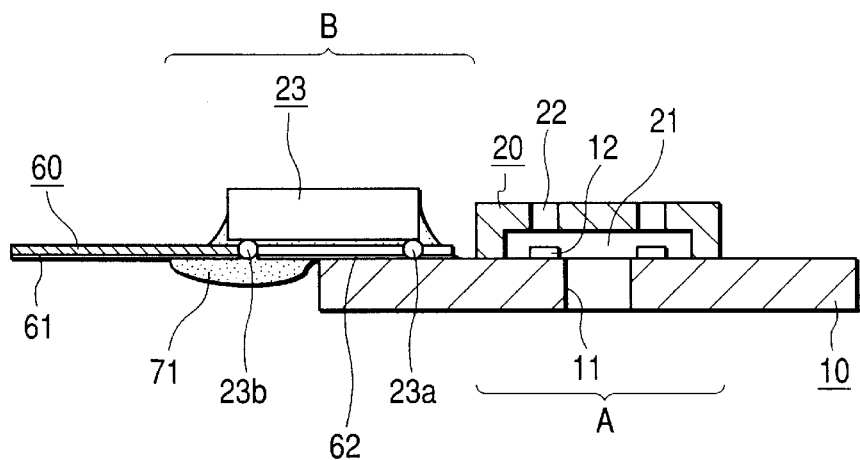
FIG. 5 is a cross-sectional view which shows a third embodiment schematically.
Figure 6:
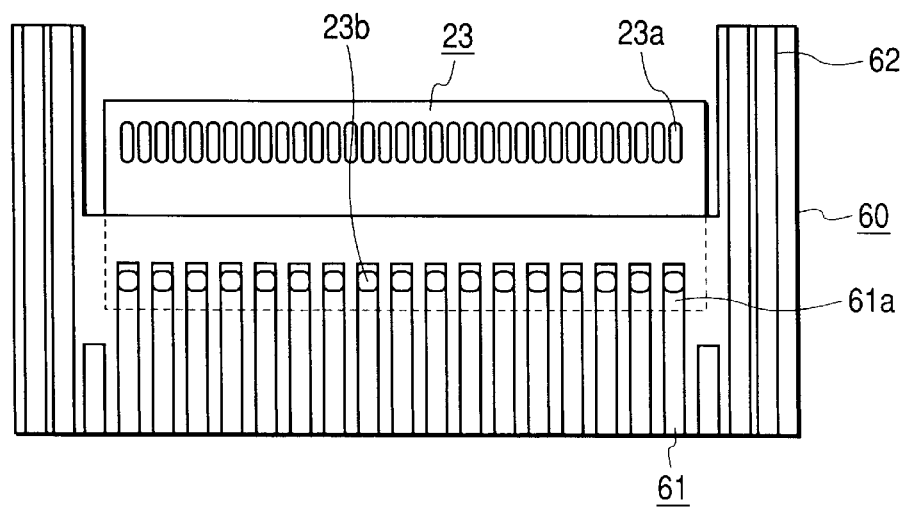
FIG. 6 is a plan view which shows only the IC package of the head represented in FIG. 5.

FIG. 5 and FIG. 6 are views which illustrate a third embodiment. These are side sectional view and partial plan view, respectively. This embodiment uses the IC package structure which makes it possible to improve any portions of the first and second embodiments yet to be improved as given below.

In other words, the assembling structure of a long-sized side shooter type recording head may sometimes invite the lower driving efficiency of electrothermal converting element, the variation of printing quality, the lowered printing speed, or the like eventually due to the increased wiring resistance of the circuit from the power supply source to the GND line by way of wiring of each part, electro-thermal converting element, and switching element of the IC chip. To cope with this situation, the chip size of the IC chip should be made larger in order to reduce the wiring resistance or there may occur some other new problems. Thus, there is still some room for improvement for the achievement of the objectives to provide an elongated side shooter type recording head that can be manufactured as a good product with an enhanced yield so as to be appropriately adoptable by the industry.

Figure 11:
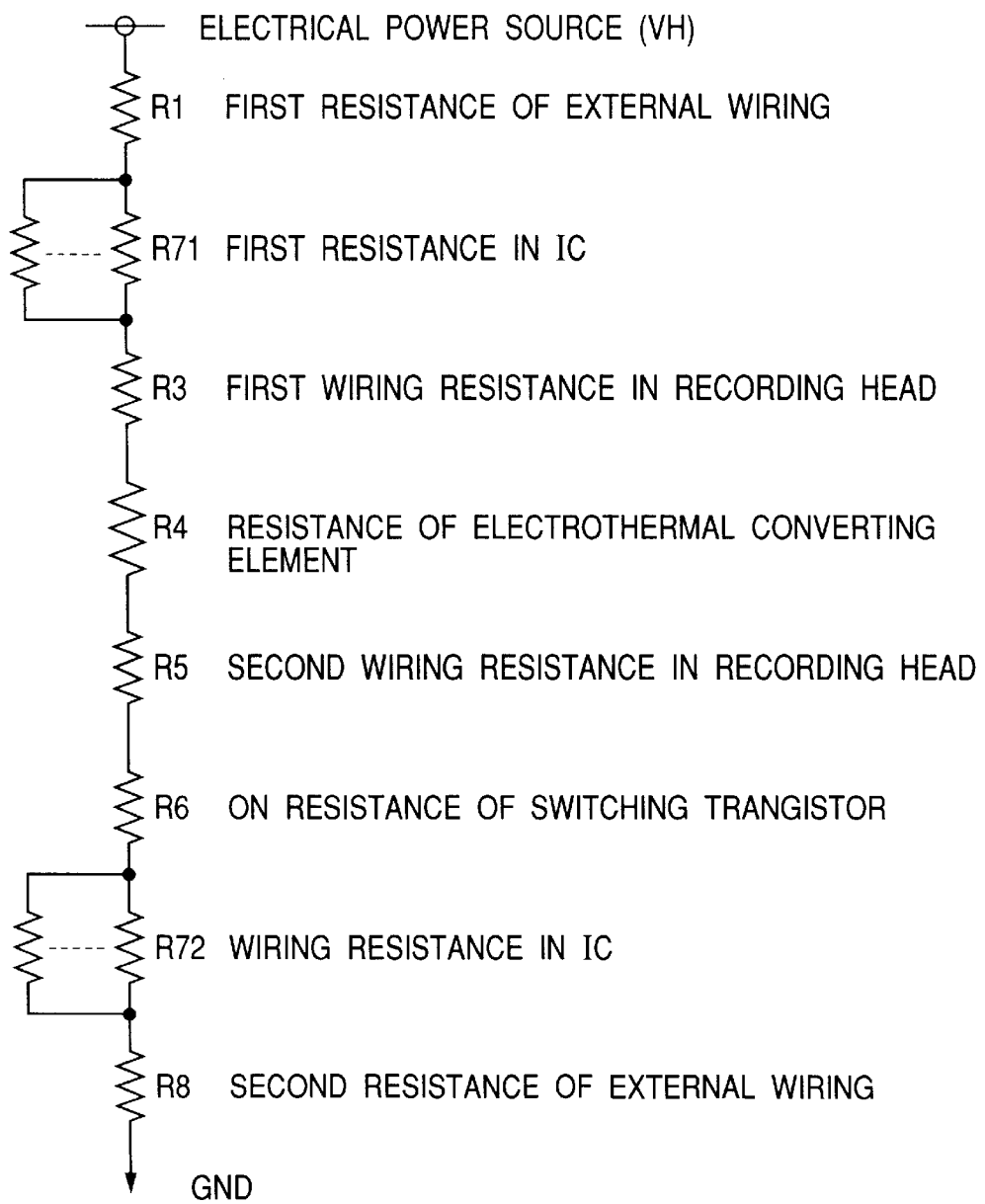
FIG. 11 is a view which shows the equivalent circuit for the heads represented in FIG. 1 and FIG. 2.

To describe more precisely, FIG. 11 is a view which shows the equivalent circuit of the control circuit used for the first and second embodiments. The power supply source VH is connected with the GND through the supply source cord and a first resistor R1 of the external wiring of the flexible printed substrate, a first wiring resistor R71 in the IC for resistance at the IC inner wiring and the connecting portion, a first wiring resistor R3 in the recording head, a resistor R4 of the electrothermal converting element, a second wiring resistor R5 in the recording head, an ON resistor R6 of the switching transistor of the driving circuit, a second wiring resistor R72 in the IC for resistance at the IC inner wiring and the connecting portion, and the supply source cord and a second resistor R8 of the external wiring of the flexible printed substrate.

It is possible to set the power supply cord, the external wiring resistors R1 and R8 of the flexible printed substrate formed by etching, plating, or sputtering copper wire of 12 to 35 micron thick, and the inner wiring resistors R3 and R5 in the recording head that form conductor in a film thickness of 5 to 20 $\mu$m with Al wiring or the like plated with Au or the like at a value small enough against the resistor R4 of the electrothermal converting element, but the resistive value of the IC inner wiring resistors R71 and R72 for resistance at the IC inner wiring and the connecting portion cannot be made smaller, because inside the IC is formed by Al wiring of approximately 1 $\mu$m thick. Therefore, as shown in FIG. 11, it is devised that the wiring width is made larger to reduce the resistive value by arranging plural connecting portions or by setting the number of wiring in plural.

The two locations of the IC inner wiring and the connection portions, such as at R71 and R72, may stand in the way of making the IC chip size smaller as the driving element. Then, in order to attain the objectives of providing an elongated side shooter type recording head, the yield of which is enhanced to implement the production of good products appropriately adoptable for the industry, there is a more room for improvement.

The present embodiment makes it possible to improve such aspect, and provide a new IC package which is even adoptable for some other devices.

In FIG. 5 and FIG. 6, the ink discharge port area A and the IC chip 23 are structured in the same manner as those shown in FIG. 1. The same reference marks are applied thereto, and the description thereof will be omitted.

The flexible printed substrate 60 connected to the IC chip 23 is provided with a first electrode 61 serving as the first external fetch electrode, and a second electrode 62 serving as the second external fetch electrode. Then, the bump 23b of the IC chip 23 is positioned to the connecting portion 61a of the first electrode 61 of the flexible printed substrate 60, and directly connected therewith by means of anisotropic conductive film (ACF).

This connecting method is not necessarily limited to using ACF. There may be adoptable the method in which the hardening and contracting force of bonding agent is utilized to press the bump 23b and the first electrode 61 to be in contact, and held by insulation bonding agent or the method in which the connection is made by use of eutectic crystal alloy, such as Au—Au or Au—Sn, and sealed by resin, among some others. As to the bump arrangement, too, it may be possible to arrange the extruded electrodes in zigzag form. The second electrode 62 of the flexible printed substrate 60 is arranged in a position different from the first electrode 61.

This IC package is provided with the first electrode 61 of the flexible printed substrate 60 and the second electrode 62 of the flexible printed substrate 60 functioning as the external fetch electrodes, respectively, and operates when connected with another substrate or component as described earlier.

The second electrode 62 of the flexible printed substrate 60 may be connected with the electrode that supplies electrical signals to the substrate in such a manner as to enable it to detour the IC chip 23 by arranging a part of the first electrode 61 to be extruded as shown in FIG. 6 or arranged to be connected with the bump 23b of the IC chip 23 on the input side so as to supply the source power and input signals.

Figure 8:
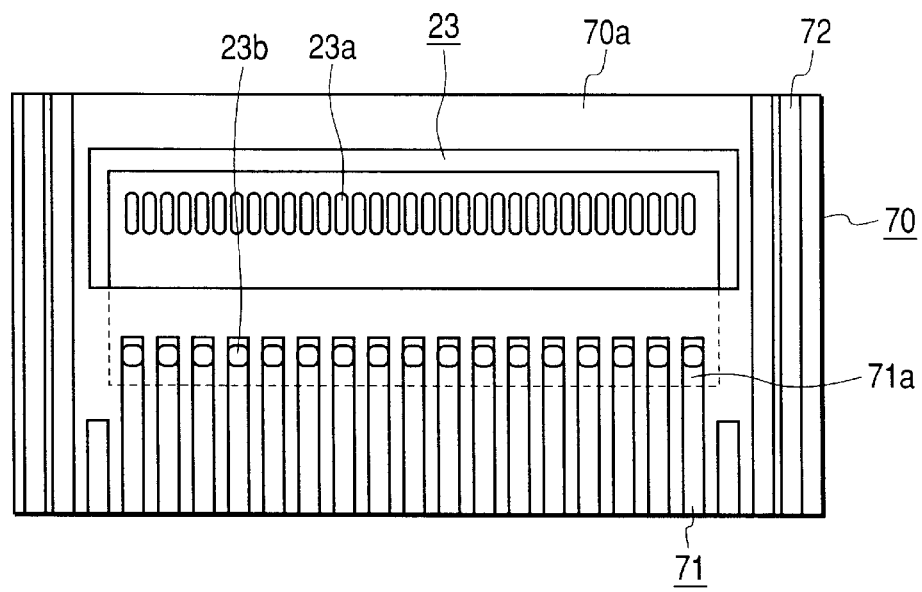
FIG. 8 is a plan view which shows one variational example of the IC package in accordance with the third embodiment.

Also, as shown in FIG. 8, it may be possible to use a flexible printed substrate 70 provided with the connecting portion 70a that connects the second electrode 72 detouring both side ends of the IC chip 23. In this case, the left- and right-side second electrodes 72 are fixed to make it characteristically easier to be carried. This arrangement demonstrates excellent effects particularly when used for the TAB (Tape Automated Bonding) method in which manufacture and assembly are executed in reel.

Figure 10:
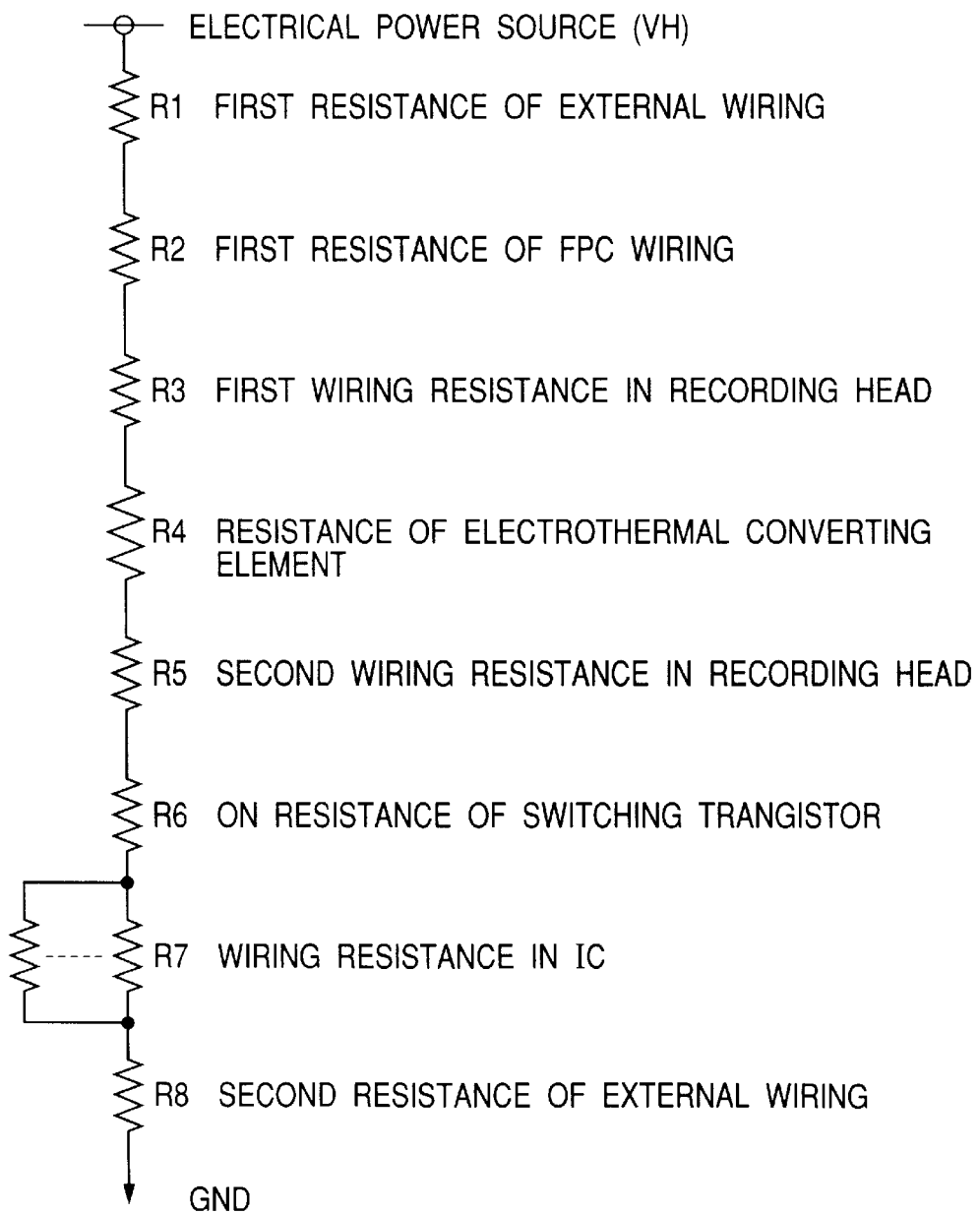
FIG. 10 is a view which shows the equivalent circuit for the head represented in FIG. 5.

FIG. 10 shows the equivalent circuit that represents the control circuit in FIG. 5. This circuit is provided with the ON resistor R6 of the switching transistor in the conduction ON state with the bump 23a of the IC chip 23 for output signals, and while the bump 23b of the aforesaid IC chip 23 and the first electrode 61 of the flexible printed substrate 60 are connected, the first electrode 61 is connected with the external control substrate. Then, there is provided the external wiring second resistor R8 for the control system signals consisting of the input and output signals for controlling the supply source potential for control use, and the grounding potential (GND). The second electrode 62 of the flexible printed substrate 60 is connected with the electrodes of the substrate 10, thus having the external wiring first resistor R1 and the FPC wiring resistor R2 by applying the supply source potential (VH) to the substrate 10 of the recording head through the external control substrate.

Figure 12:
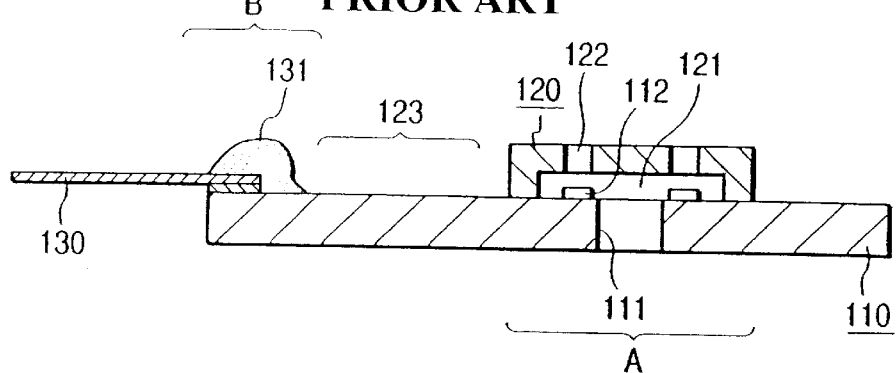
FIG. 12 is a view which schematically shows one conventional example.

The resistor R4 of the electrothermal converting element, the wiring resistors R3 and R5 in the recording head, and the wiring resistor R8 in the IC are fundamentally the same as those shown in FIG. 12.

As understandable from this equivalent circuit, the VH signals are supplied through the second electrode 62 of the flexible printed substrate 60 formed by copper wiring of 12 to 35 micron thick by means of etching, plating, or sputtering. In this way, the wiring resistance from the power supply source VH to the GND line is reduced to enhance the driving efficiency of the electrothermal converting element and the printing quality, as well as the printing speed, and, further, to contribute to making the IC chip that functions as a driving element smaller.

In this respect, the supporting structure shown in FIG. 9 is also applicable to the head shown in FIG. 5. FIG. 7A is a plan view which shows the elongation embodiment of the head shown in FIG. 5. Here, using the same reference marks as those appearing in FIG. 5 the detailed description will be omitted. For this embodiment, an ink supply port 11 is provided to be open commonly to plural sets of the flexible printed substrates 60 and the IC chips 23 connected therewith.

For the embodiments described above, the structure is such that the IC chip is arranged and connected with the flexible printed substrate, and the description has been made of the mode in which such structure is provided for one side of the substrate in relation to the ink supply port. However, the present invention is not necessarily limited thereto. For example, the invention includes the mode in which such structure is provided for either side of the substrate in relation to the ink supply port.

Figure 13:
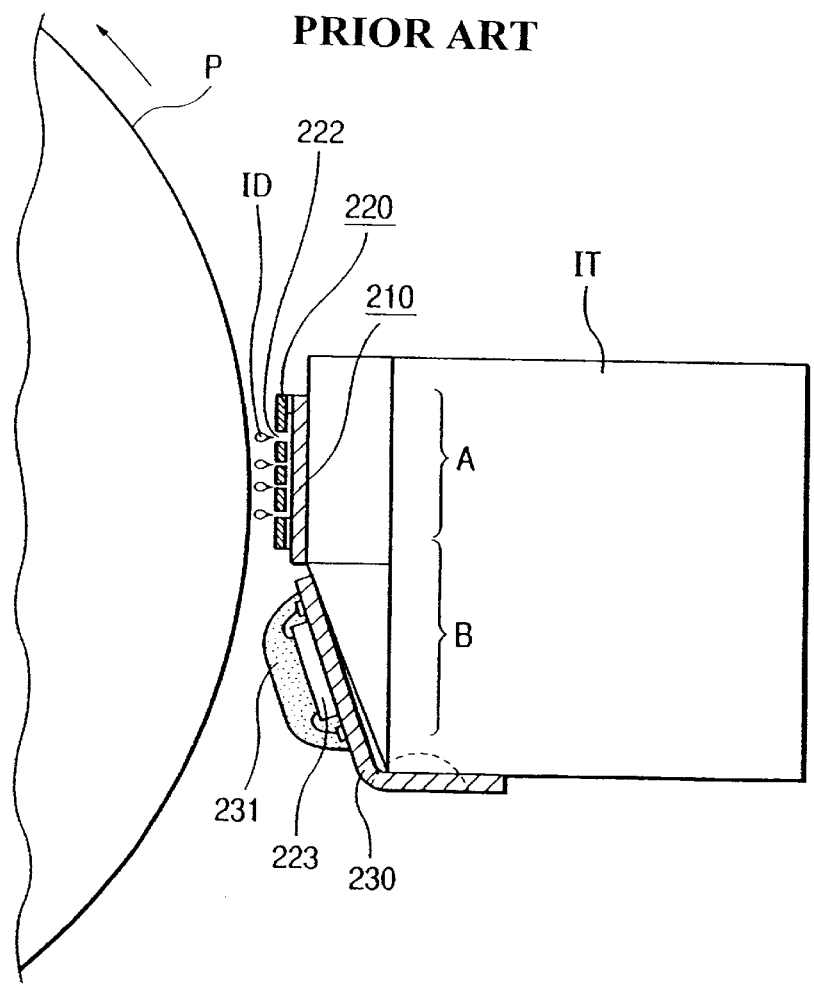
FIG. 13 is a view which schematically shows another conventional example.

The liquid discharge apparatus of the present invention is provided with conveying means for a recording medium P conveyed to face the liquid discharge port of the aforesaid liquid discharge head, for example (see FIG. 13).

What is claimed is:

1. A liquid discharge head comprising:

an element substrate having on one surface thereof an energy generating element for generating energy to be utilized for discharging liquid from a liquid discharge port, and a liquid supply port communicated with said liquid discharge port;

a printed substrate provided with an external fetch electrode; and an IC component for controlling said energy generating element, said IC component having an output side electrode connected with said energy generating element and an input side electrode connected with said external fetch electrode, wherein at least said output side electrode of said IC component is provided on said one surface of said element substrate, and wherein a thickness h1 of a liquid flow path formation layer for forming a liquid flow path communicated with said liquid discharge port and said liquid supply port, a clearance h2 between said liquid discharge port and a recording medium, a cockling amplitude h3 of the recording medium, and an assembling height H of said IC component from said one surface of said element substrate satisfy the relation expressed by the following formula:

$$H < h1 + h2 - h3/2.$$

2. A liquid discharge head according to claim 1, wherein an end portion of said printed substrate where said external fetch electrode is located, is provided on said one surface of said element substrate.

3. A liquid discharge head according to claim 1, wherein said liquid supply port and said printed substrate are arranged on opposite sides of said IC component.

4. A liquid discharge head according to claim 1, wherein said output side electrode is directly connected with an electrode on said one surface of said element substrate.

5. A liquid discharge head according to claim 1, wherein said output side electrode is directly connected to a first electrode on said one surface of said element substrate, and said input side electrode is directly connected with a second electrode on said one surface of said element substrate.

6. A liquid discharge head according to claim 1, wherein said external fetch electrode comprises a first external fetch electrode connected with the input side electrode of said IC component for control use, and a second external fetch electrode directly connected with the electrode on said one surface of said element substrate.

7. A liquid discharge head according to claim 1, wherein the relation expressed by the following formula is satisfied:

$$h1 + h3/2 < H < h1 + h2 - h3/2.$$

8. A liquid discharge head according to claim 1, wherein said IC component is sealed by a sealing resin, and the assembling height H is a height at a vertex of said sealing resin.

9. A liquid discharge head according to claim 1, the assembling height H of said IC component is within a range of 0.22 to 0.90 mm.

10. A liquid discharge head according to claim 1, wherein said IC component is arranged on a feed side of a recording medium in relation to said liquid discharge port.

11. A liquid discharge head according to claim 1, wherein a plurality of liquid discharge ports are arranged so as to provide a preciseness of 600 dpi or more.

12. A liquid discharge head according to claim 1, wherein a length of a liquid discharge port group is 25 mm or more.

13. A liquid discharge head according to claim 1, wherein said IC component for control use is assembled on said element substrate by a resin layer having conductive particles dispersed in an insulating resin.

14. A liquid discharge head according to claim 1, wherein said IC component for control use is assembled on said element substrate by an anisotropic conductive film or an anisotropic conductive paste.

15. A liquid discharge head according to claim 1, wherein an insulation film is provided for the reverse side of said IC component for control use.

16. A liquid discharge head according to claim 1, wherein liquid is discharged from said liquid discharge port almost perpendicularly to said one surface of said element substrate.

17. A liquid discharge head according to claim 1, wherein said energy generating element is an electrothermal converting element for generating thermal energy to be utilized for discharging liquid.

18. A liquid discharge apparatus comprising:

a liquid discharge head comprising an element substrate having on one surface thereof an energy generating element for generating energy to be utilized for discharging liquid from a liquid discharge port, and a liquid supply port communicated with said liquid discharge port; a printed substrate provided with an external fetch electrode; and an IC component for controlling said energy generating element, said IC component having an output side electrode connected with said energy generating element and an input side electrode connected with said external fetch electrode, wherein at least said output side electrode of said IC component is provided on said one surface of said element substrate, and wherein a thickness h1 of a liquid flow path formation layer for forming a liquid flow path communicated with said liquid discharge port and said liquid supply port, a clearance h2 between said liquid discharge port and a recording medium, a cockling amplitude h3 of the recording medium, and an assembling height H of said IC component from said one surface of said element substrate satisfy the relation expressed by the following formula:

$$H < h1 + h2 - h3/2, \text{ and}$$

conveying means for conveying a recording medium to face said liquid discharge port of said liquid discharge head.

* * * * *

UNITED STATES PATENT AND TRADEMARK OFFICE
CERTIFICATE OF CORRECTION

PATENT NO. : 6,702,413 B2
DATED : March 9, 2004
INVENTOR(S) : Hiroshi Takabayashi et al.

It is certified that error appears in the above-identified patent and that said Letters Patent is hereby corrected as shown below:

Title page,
Item [57], ABSTRACT,
Line 2, "energy" should read -- an energy --.

Drawings,
Sheet 7, Figure 10, "TRANGISTOR" should read -- TRANSISTOR --.
Sheet 8, Figure 11, "TRANGISTOR" should read -- TRNASISTOR --

Column 2,
Line 35, "layer 221" should read -- layer 220 --; and
Line 61, "ration" should read -- ratio --.

Column 3,
Line 43, "energy" (first occurrence) should read -- an energy --.

Column 4,
Line 2, "use" should read -- using --.
Line 10, "ports," should read -- port, --; and
Line 36, "direction" should read -- directly --.

Column 5,
Line 24, "the" should be deleted.

Column 8,
Line 26, "the kind" should read -- this kind --.

Column 9,
Line 28, "H1+h3/h2<H1<hH" should read -- h1+h3/h2<H1<hH --.

Column 11,
Line 30, "a" should be deleted.

UNITED STATES PATENT AND TRADEMARK OFFICE
CERTIFICATE OF CORRECTION

PATENT NO.    : 6,702,413 B2
DATED         : March 9, 2004
INVENTOR(S)   : Hiroshi Takabayashi et al.

It is certified that error appears in the above-identified patent and that said Letters Patent is hereby corrected as shown below:

Column 14,
Line 1, "claim 1," should read -- claim 1, wherein --.

Signed and Sealed this

Third Day of August, 2004

JON W. DUDAS
*Acting Director of the United States Patent and Trademark Office*